(12) United States Patent
Nakagawara et al.

(10) Patent No.: US 7,213,322 B2
(45) Date of Patent: May 8, 2007

(54) METHOD FOR MANUFACTURING SURFACE ACOUSTIC WAVE DEVICE

(75) Inventors: Osamu Nakagawara, Rittou (JP); Akinori Shinoda, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 497 days.

(21) Appl. No.: 10/792,543

(22) Filed: Mar. 3, 2004

(65) Prior Publication Data

US 2004/0200054 A1  Oct. 14, 2004

(30) Foreign Application Priority Data

Apr. 11, 2003  (JP) ............... 2003-107967

(51) Int. Cl.
*H04R 31/00*   (2006.01)
(52) U.S. Cl. ............. 29/594; 29/25.35; 29/592.1; 29/609.1; 204/192.32; 204/192.33; 204/192.35; 216/62; 216/66; 310/313 A; 310/313 B; 310/313 R; 310/364; 333/193; 333/195
(58) Field of Classification Search ........... 29/25.35, 29/592.1, 594, 609.1; 216/62, 66; 204/192.32, 204/192.33, 192.35; 310/313 A, 313 B, 310/313 R, 364; 333/193, 195
See application file for complete search history.

(56) References Cited

U.S. PATENT DOCUMENTS 6,630,767 B2 * 10/2003 Inoue et al. ............ 310/313 A
6,657,366 B2 * 12/2003 Watanabe et al. ........... 310/364
6,822,371 B2 * 11/2004 Nakagawara et al. ... 310/313 R
2002/0008437 A1  1/2002 Inoue et al.
2002/0074904 A1  6/2002 Watanabe et al.

FOREIGN PATENT DOCUMENTS

| EP | 1 158 669 A2 | 11/2001 |
| JP | 54060883 A * | 5/1979 |
| JP | 08-195635 | 7/1996 |
| JP | 2002-368568 | 12/2002 |
| JP | 2003-069357 | 3/2003 |
| JP | 2003-69357 | 3/2003 |

OTHER PUBLICATIONS

Passive and remote sensing based upon surface acoustic wave in special enviroments Dai Enguang; Feng Guanping; Microwave and Optoelectronics Conference, 1997; Aug. 11-14, 1997; pp. 133-139 vol. 1.*
Osamu Nakagawara et al.; "Epitaxially Grown Aluminum Films With Titanium Intermediate Layer on 0Rotated Y-X LiNbO$_3$ Piezoelectric Single Crystal Substrates"; Journal of Crystal Growth; No. 249; Mar. 2003; pp. 497-501.

* cited by examiner

*Primary Examiner*—Paul D Kim
(74) *Attorney, Agent, or Firm*—Keating & Bennett, LLP

(57) ABSTRACT

A piezoelectric substrate is provided with interdigital transducer electrodes including a first electrode layer, a second electrode layer, and a third electrode layer that is principally made of aluminum. The piezoelectric substrate has a stepped structure on the surface of the piezoelectric substrate, the stepped structure including terraces each having a width of about 50 nm or less and steps each having a width of a mono-molecular layer (e.g., about 14 Å).

15 Claims, 4 Drawing Sheets

Max: 369
Psi: 60.0
Phi: 209.5

METHOD FOR MANUFACTURING SURFACE ACOUSTIC WAVE DEVICE

BACKGROUND OF THE INVENTION

1. Field of the Invention

The present invention relates to a surface acoustic wave device such as a surface acoustic wave resonator and a surface acoustic wave filter, and a method for manufacturing the surface acoustic wave device, and more specifically, the present invention relates to a method for manufacturing a surface acoustic wave device provided with high-power durable electrodes for high-frequency operation and high-power operation.

2. Description of the Related Art

In recent years, surface acoustic wave devices including a desired electrode pattern disposed on a piezoelectric substrate have been widely used for surface acoustic wave filters and surface acoustic wave resonators with the development of mobile phones and mobile communication systems. The electrodes of the surface acoustic wave devices are made of aluminum from the outset of development due to a low specific gravity and a low electrical resistance of aluminum. On the other hand, a surface acoustic wave device designed for high-frequency operation requires thinning electrode layers and miniaturizing an electrode pattern. The electrode layers on a piezoelectric substrate of a surface acoustic wave device are subjected to repeated stresses that depend on the frequency applied thereto during operation. Further, the stresses applied to the electrode layers constituting the surface acoustic wave device increase with an increase in operating power and frequency. These applied stresses cause migration of aluminum atoms of the thinned and miniaturized electrode layers of aluminum, resulting in the occurrence of defects in the aluminum electrode layers. There is a problem that the defects significantly impair the properties of the surface acoustic wave device.

Measures for enhancing the power durability and the reliability of the electrode layers by improving the orientation and controlling the crystallinity of the aluminum layers are known. These measures are significantly affected by the surface condition of the substrate used to construct the surface acoustic wave device. As a result, these measures have problems in which the aluminum layers have insufficient stability. Moreover, these measures also have problems in which the aluminum layers have insufficient properties suitable for further increased high-frequency operation and high-power operation.

Thus, a method for manufacturing a surface acoustic wave device that has electrodes made of single-crystal aluminum or an aluminum-based alloy disposed on a substrate made of lithium tantalate ($LiTaO_3$) or lithium niobate ($LiNbO_3$) is disclosed in Japanese Unexamined Patent Application No. 8-195635. This conventional method includes a process for removing impaired surface layers of the substrate prior to forming the electrodes made of the single-crystal aluminum or the aluminum-based alloy, the process including an ion implantation step, a chemical etching step, and an oxidation step, the steps being performed in that order.

However, surface acoustic wave devices disclosed in the known art described above have the following problems.

Japanese Unexamined Patent Application No. 8-195635 discloses that pretreatment for achieving a desired surface condition of the substrate before forming the electrode layers includes the steps of ion implantation, chemical etching, and oxidation. In the ion implantation step, the surface of the substrate is treated with an ionized inert gas or ionized nitrogen. This step requires a vacuum unit having desired functions. The substrate is subjected to the chemical etching, followed by the oxidation. This oxidation is performed with, for example, aqueous hydrogen peroxide, ozone, oxygen plasma, or oxygen radical. As a result, the oxidation step requires a unit having desired functions.

Consequently, many steps and a plurality of units for the treatment are required to achieve a desired surface acoustic wave device. Thus, the method described in Japanese Unexamined Patent Application No. 8-195635 has a problem in which manufacturing cost is high. The method also has another problem in which power durability is insufficient for further increased high-frequency operation and high-power operation.

SUMMARY OF THE INVENTION

In a surface acoustic wave device, it is known that the use of electrodes made of epitaxial aluminum films having a twin-crystal structure improves the power durability of the surface acoustic wave device, and the twin-crystal structure is remarkably affected by the surface condition of the substrate.

The Inventors of the present invention produced a surface acoustic wave device having remarkably improved power durable electrode films, the surface acoustic wave device having a desired surface structure that remarkably improves the crystallinity of electrode films formed on the surface of the substrate, and also invented a method for forming the electrode films on the substrate that remarkably improves the crystallinity of electrode films formed on the substrate.

To solve the problems described above, a preferred embodiment of the present invention provides a method for manufacturing a surface acoustic wave device that has main electrodes formed on a base electrode on a piezoelectric substrate, the method including a step of forming a stepped structure on a surface of the piezoelectric substrate, the stepped structure including terraces each having a width of about 50 nm or less and steps each having a width of a mono-molecular layer, a step of forming a first electrode layer and a second electrode layer for forming the base electrode, the first electrode layer and the second electrode layer improving the crystallinity of the main electrodes, and a step of forming a third electrode layer for forming the main electrodes on the second electrode layer, the third electrode layer being mainly composed of aluminum.

In addition, the step of forming a stepped structure on the surface of the piezoelectric substrate includes etching the surface of the piezoelectric substrate with a mixture principally containing at least one of phosphoric acid, pyrophosphoric acid, benzoic acid, octanoic acid, hydrochloric acid, nitric acid, sulfuric acid, hydrofluoric acid, buffered hydrofluoric acid, and potassium bisulfate.

Moreover, the step of forming a stepped structure on the surface of the piezoelectric substrate includes etching the surface of the piezoelectric substrate with a mixture that includes a nitric acid solution and a hydrofluoric acid solution and is heated, the volume ratio of the nitric acid solution to the hydrofluoric acid solution being approximately two to one.

Further, the first electrode layer is preferably formed on the piezoelectric substrate having a surface temperature of about 70° C. or more, and the second electrode layer and the third electrode layer are formed after the piezoelectric substrate is cooled to a surface temperature of about 50° C. or less.

Furthermore, the first electrode layer and the second electrode layer are preferably made of titanium.

The manufacturing method according to preferred embodiments of the present invention can provide a surface acoustic wave device having excellent power durability, high precision, and high reliability for a high-performance electronic apparatus without impairing the characteristics of a piezoelectric substrate and without greatly increasing the manufacturing cost.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will now be described in detail with reference to the drawings below.

Figure 1:
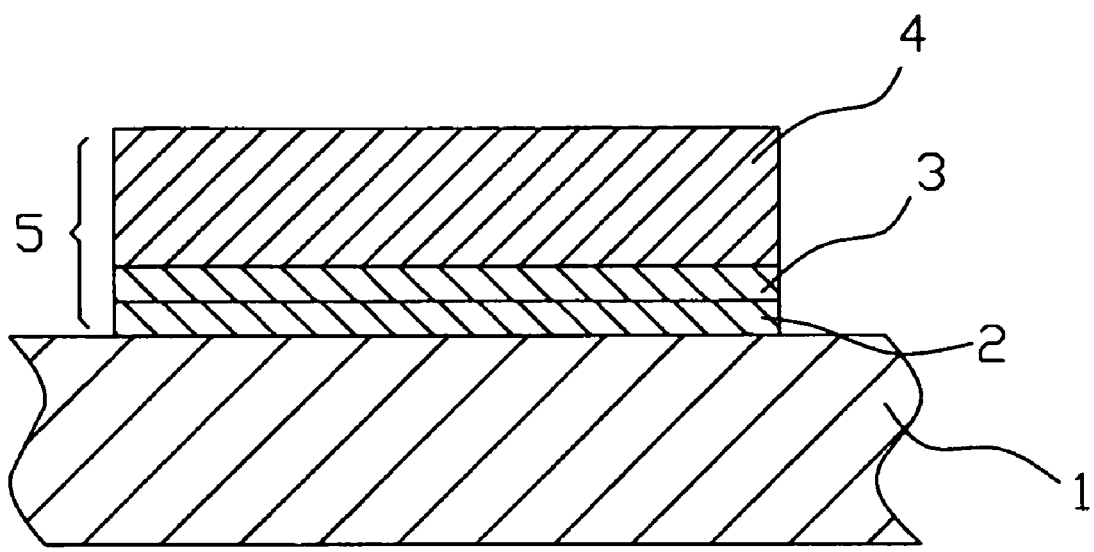
FIG. 1 is a schematically sectional view showing an example of a surface acoustic wave device produced by a method for manufacturing a surface acoustic wave device according to a preferred embodiment of the present invention.

FIG. 1 illustrates a schematically sectional view of an example of the surface acoustic wave device manufactured by the manufacturing method of a preferred embodiment of the present invention.

A surface acoustic wave device 20 shown in FIG. 1 includes a piezoelectric substrate 1, a first electrode layer 2 on the piezoelectric substrate 1, a second electrode layer 3 on the first electrode layer 2, and a third electrode layer 4 on the second electrode layer 3.

Figure 2:
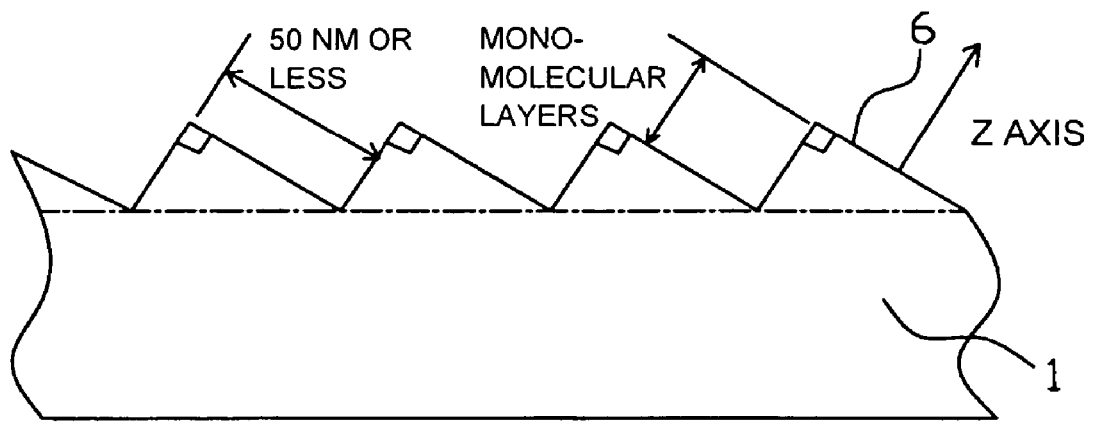
FIG. 2 is a schematically enlarged sectional view showing an example of a surface of a piezoelectric substrate of a surface acoustic wave device produced by a method for manufacturing a surface acoustic wave device according to a preferred embodiment of the present invention.

For the piezoelectric substrate 1, a $\theta°$-rotated Y-cut X-propagation lithium niobate ($LiNbO_3$) substrate or lithium tantalate ($LiTaO_3$) substrate is preferably used. As shown in FIG. 2, the surface of the piezoelectric substrate 1 has a stepped structure including terraces having a width of about 50 nm or less, for example, and steps having a width of a mono-molecular layer.

A width of a mono-molecular layer depends on the crystal structure of the material used for the substrate. For example, when an inorganic material is used for the substrate, a width of the mono-molecular layer ranges from several Å to several dozens of Å. In the preferred embodiments of the present invention in which either a $LiNbO_3$ substrate or a $LiTaO_3$ substrate is preferably used, the width of a mono-molecular layer is about 14 Å.

In addition, the first electrode layer 2 and the second electrode layer 3 are preferably made of titanium. Further, the third electrode layer 4 is preferably made of a metal principally containing aluminum. The first electrode layer 2 and the second electrode layer 3 contribute to improving the crystallinity of the third electrode layer 4. Further, the first electrode layer 2, the second electrode layer 3, and the third electrode layer 4 functions as interdigital transducer (IDT) electrodes 5.

The manufacturing method according to a preferred embodiment of the present invention will now be described in detail below.

First, the surface of the piezoelectric substrate 1, for example, a 38.5°-rotated Y-cut X-propagation $LiTaO_3$ is etched. The etching includes a step of heating a mixture of an approximately 60% nitric acid solution and an approximately 46% hydrofluoric acid solution at a temperature of about 85° C. in a hot water bath or the like, the volume ratio of the nitric acid solution to the hydrofluoric acid solution being about two to one. Next, the 38.5°-rotated Y-cut X-propagation $LiTaO_3$ substrate 1 is immersed in the mixture maintained at a temperature of about 85° C. for approximately one hour, thus, the surface of the substrate is etched. The mixture may principally include at least one of phosphoric acid, pyrophosphoric acid, benzoic acid, octanoic acid, hydrochloric acid, nitric acid, sulfuric acid, hydrofluoric acid, buffered hydrofluoric acid, and potassium bisulfate. In this case, a treating temperature and a treating time are determined depending on the composition of the selected mixture. Subsequently, the etched substrate is sufficiently rinsed with pure water, and dried.

Next, the surface condition of the piezoelectric substrate 1 formed by the etching treatment will be described in detail.

The etching treatment described above forms Z surfaces that define terraces by selective etching of higher index surfaces of the surface of the piezoelectric substrate 1. Consequently, as shown in FIG. 2, a micro-stepped structure that includes Z surfaces 6 that define terraces having a width of about 50 nm or less, for example, and steps having a width of a mono-molecular layer (e.g., about 14 Å) is formed on the surface of the piezoelectric substrate 1. An electrode layer formed on this micro-stepped structure readily grows by step-flow mode. As a result, a highly oriented electrode film can be formed.

Next, the interdigital transducer electrodes 5 are formed on the piezoelectric substrate 1 by photolithography.

First, the piezoelectric substrate 1 is disposed in an evaporator having multiple crucibles in order to form the interdigital transducer electrodes 5.

Next, the evaporator is vacuumed with a vacuum pump. At this time, the chamber of the evaporator preferably has a pressure of about $1 \times 10^{-5}$ Pa with a high performance vacuum pump.

Next, as the first electrode layer 2, a titanium layer having a thickness of about 10 nm, for example, is formed on the piezoelectric substrate 1 by an electron-beam evaporation process. At this time, the piezoelectric substrate 1 is controlled at a temperature of about 180° C. during evaporation. Next, the piezoelectric substrate 1 is cooled at a temperature of about 50° C. or less while the vacuum condition is maintained in the evaporator. Next, as the second electrode layer 3, a titanium layer having a thickness of about 10 nm is formed. After the crucibles are rotated, an aluminum layer having a thickness of about 150 nm is formed as the third electrode layer 4.

It is preferred that the first electrode layer 2 made of titanium be formed on the piezoelectric substrate 1 that was heated at about 70° C. or more. Furthermore, it is preferred that the second electrode layer 3 and then the third electrode layer 4 be formed after the piezoelectric substrate is cooled to a surface temperature of about 50° C. or less, the third electrode layer 4 being formed on the second electrode layer 3. As a result, inhibition of the crystal growth of the third electrode layer 4 by interdiffusion between titanium in the second electrode layer 3 and aluminum in the third electrode layer 4 is suppressed. As a result, the resulting third electrode layer 4 exhibits high crystallinity.

These electrode layers are preferably formed in succession while the vacuum condition is maintained. During the process, the piezoelectric substrate 1 is preferably rotated at about 5 rpm such that a uniform film thickness is achieved. In addition, a shutter is disposed above the crucible. The film thickness is determined by controlling closing and opening of the shutter. This film forming method is not limited to the electron-beam evaporation process. Any other process, for example, a sputtering process may also be used.

In addition, the third electrode layer may be made of an alloy including aluminum as a major component and trace amounts of additives improving power durability, for example, copper, magnesium, and nickel, instead of pure aluminum.

Next, the resulting electrode layers are coated by a resist with a predetermined film thickness using a spin coater. The coated resist film is exposed through a photolithographic mask having a predetermined pattern. Subsequently, through developing and etching, interdigital transducer electrodes 5 are formed.

The resulting interdigital transducer electrodes 5 have a pattern suitable for a required function, for example, a finger-shaped pattern with a line-and-space of about 0.5 μm, for example. In addition, lead line electrodes, pad electrodes, and the like are formed, if necessary. After dicing, packaging, and the like, the surface acoustic wave device 20 is completed.

Figure 3:
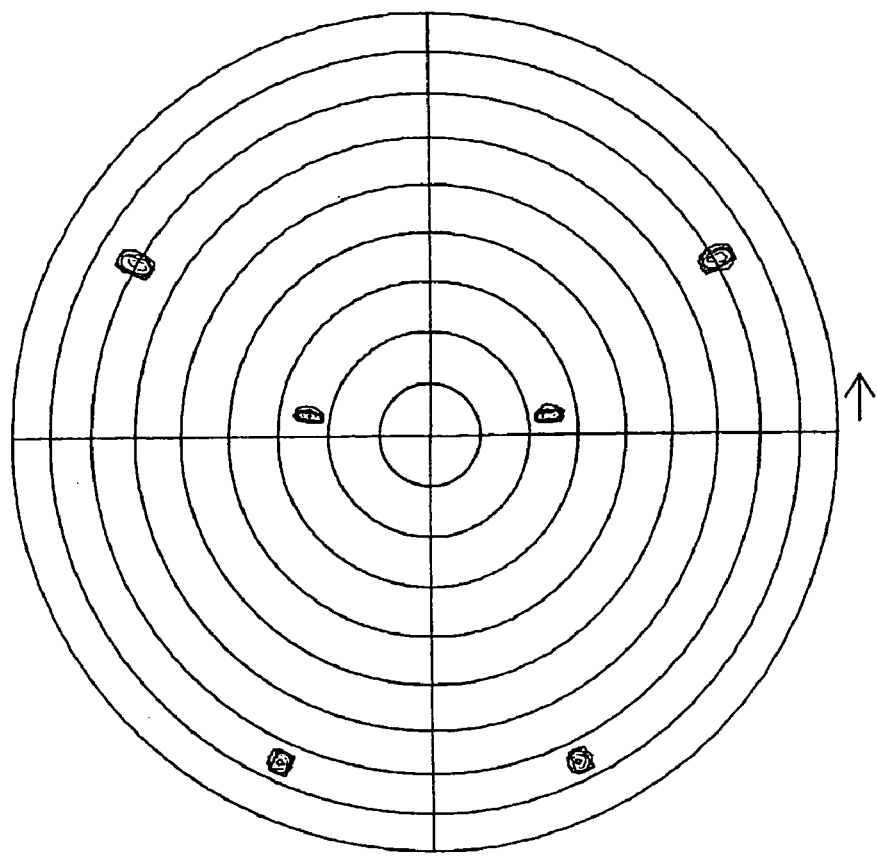
FIG. 3 is an X-ray diffraction pole figure showing an example of an aluminum electrode layer of a surface acoustic wave device obtained by a method for manufacturing a surface acoustic wave device according to a preferred embodiment of the present invention.

FIG. 3 illustrates an X-ray diffraction pole figure of the third electrode layer 4 formed by the above-mentioned method.

Figure 4:
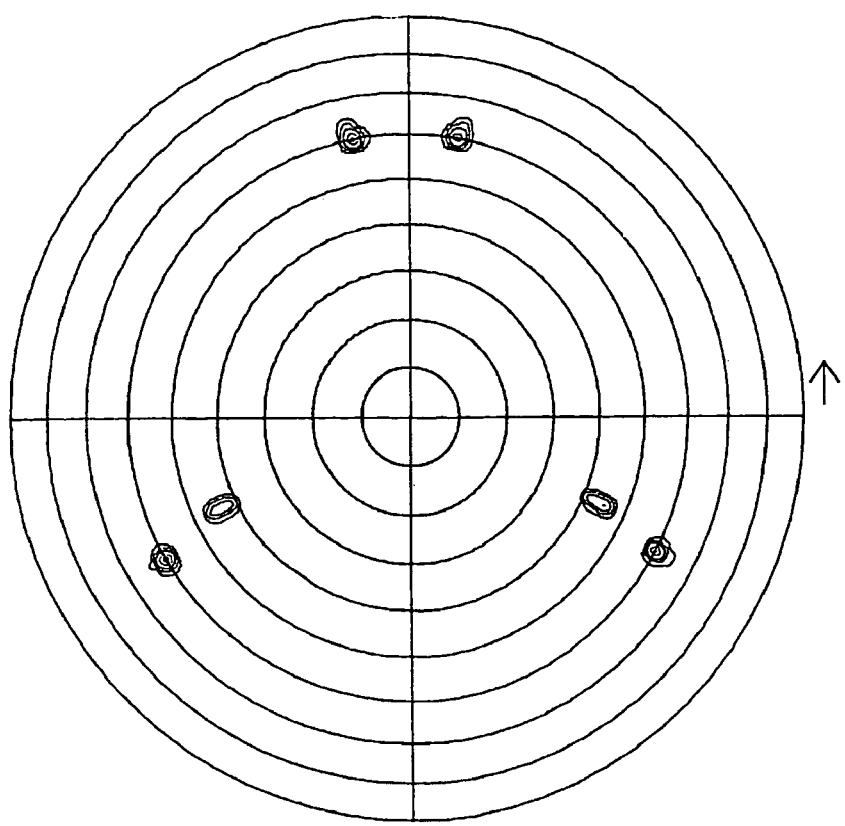
FIG. 4 is an X-ray diffraction pole figure showing an example of an aluminum electrode layer of a surface acoustic wave device obtained by a prior art method for manufacturing a surface acoustic wave device.

FIG. 3 is a (200) pole figure of the aluminum layer. Diffraction spots having a plurality of centers of symmetry are observed. This shows epitaxial aluminum film having high crystallinity. These spots of the pole figure are very sharp and have a peak intensity of 692 cps. As shown in FIG. 4, a peak intensity of 369 cps is observed from a known piezoelectric substrate having a general surface condition that is different from the surface condition of the piezoelectric substrate 1 according to preferred embodiments of the present invention. It is obvious that the peak intensity 692 cps observed from the surface condition according to preferred embodiments of the present invention is larger than the peak intensity of 369 cps observed from the general surface condition.

The crystal having this high crystallinity has the twin-crystal structure. This high crystallinity is characterized by both high mechanical strength due to nonuniform crystal orientation and suppressed grain boundary diffusion due to high orientation. Furthermore, this high crystallinity is based on a synergistic effect created by the effect of the surface condition of the piezoelectric substrate 1 and by the effect of a film-forming method improving the crystallinity of the first electrode layer 2, the second electrode layer 3, and the third electrode layer 4.

The above-mentioned descriptions include the results of the 38.5°-rotated Y-cut X-propagation LiTaO$_3$ piezoelectric substrate 1. A 41°-rotated Y-cut X-propagation LiNbO$_3$ substrate also exhibits similar results (not shown).

In this way, the method for manufacturing a surface acoustic wave device according to preferred embodiments of the present invention provides a surface acoustic wave device having excellent power durability, high precision, and high reliability suitable for a high-performance electronic apparatus without greatly increasing the manufacturing cost.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for manufacturing a surface acoustic wave device that has main electrodes formed on a base electrode on a piezoelectric substrate, the method comprising:
   a step of forming a stepped structure on a surface of the piezoelectric substrate, the stepped structure including terraces each having a width of about 50 nm or less and steps each having a width of a mono-molecular layer;
   a step of forming a first electrode layer and a second electrode layer for forming the base electrode, the first electrode layer and the second electrode layer improving the crystallinity of the main electrodes; and
   a step of forming a third electrode layer for forming the main electrodes on the second electrode layer, the third electrode layer being principally composed of aluminum.

2. A method for manufacturing a surface acoustic wave device according to claim 1, wherein the step of forming a stepped structure on the surface of the piezoelectric substrate comprises etching the surface of the piezoelectric substrate with a mixture principally containing at least one of phosphoric acid, pyrophosphoric acid, benzoic acid, octanoic acid, hydrochloric acid, nitric acid, sulfuric acid, hydrofluoric acid, buffered hydrofluoric acid, and potassium bisulfate.

3. A method for manufacturing a surface acoustic wave device according to claim 2, wherein the mixture is composed of a nitric acid solution and a hydrofluoric acid solution and is heated, the volume ratio of the nitric acid solution to the hydrofluoric acid solution being approximately two to one.

4. A method for manufacturing a surface acoustic wave device according to claim 1, wherein the first electrode layer is formed on the piezoelectric substrate having a surface temperature of about 70° C. or more, and the second electrode layer and the third electrode layer are formed after the piezoelectric substrate is cooled to a surface temperature of about 50° C. or less.

5. A method for manufacturing a surface acoustic wave device according to claim 1, wherein a width of a mono-molecular layer is equal to about 14 Å.

6. A method for manufacturing a surface acoustic wave device according to claim 1, wherein the first electrode layer and the second electrode layer comprise titanium.

7. A method for manufacturing a surface acoustic wave device according to claim 1, wherein the substrate is one of a 38.5°-rotated Y-cut X-propagation LiTaO$_3$ piezoelectric substrate and a 41°-rotated Y-cut X-propagation LiNbO$_3$ substrate.

8. A method for manufacturing a surface acoustic wave device according to claim 1, wherein the first, second and third electrodes define interdigital transducer electrodes.

9. A method for manufacturing a surface acoustic wave device according to claim 1, wherein the step of forming a stepped structure on the surface of the piezoelectric substrate comprises heating a mixture of an approximately 60% nitric acid solution and an approximately 46% hydrofluoric acid solution at a temperature of about 85° C. in a hot water bath, and immersing the substrate in the mixture maintained at a temperature of about 85° C. for approximately one hour.

10. A method for manufacturing a surface acoustic wave device according to claim 1, wherein the first electrode layer has a thickness of about 10 nm and is formed on the substrate by an electron-beam evaporation process.

11. A method for manufacturing a surface acoustic wave device according to claim 1, wherein the second electrode layer is made of titanium and has a thickness of about 10 nm.

12. A method for manufacturing a surface acoustic wave device according to claim 1, wherein the third electrode layer has a thickness of about 150 nm.

13. A method for manufacturing a surface acoustic wave device according to claim 1, wherein during formation of the first, second and third electrodes, a vacuum condition is maintained.

14. A method for manufacturing a surface acoustic wave device according to claim 1, wherein the third electrode includes at least one of copper, magnesium, and nickel.

15. A method for manufacturing a surface acoustic wave device according to claim 1, wherein the first, second and third electrode layers are coated by a resist using a spin coater, the coated resist film is exposed through a photo-lithographic mask having a predetermined pattern, and the resist film is developed and etched to form interdigital transducer electrodes.

* * * * *